United States Patent
Arasnia et al.

(10) Patent No.: US 6,673,696 B1
(45) Date of Patent: Jan. 6, 2004

(54) POST TRENCH FILL OXIDATION PROCESS FOR STRAINED SILICON PROCESSES

(75) Inventors: Farzad Arasnia, San Mateo, CA (US); Minh-Van Ngo, Fremont, CA (US); Qi Ziang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,848

(22) Filed: Jan. 14, 2003

(51) Int. Cl.$^7$ .......... H01L 21/76; H01L 21/461
(52) U.S. Cl. .......... 438/430; 438/424; 438/425; 438/757; 438/763
(58) Field of Search .......... 438/424, 425, 438/435, 296, 691, 699, 702, 757, 763, 791, 970, 700, 745, 756, 436, 431, 430

(56) References Cited

U.S. PATENT DOCUMENTS

| | | | | |
|---|---|---|---|---|
| 5,254,873 A | * | 10/1993 | Poon et al. | 257/751 |
| 5,406,111 A | * | 4/1995 | Sun | 257/497 |
| 6,013,937 A | * | 1/2000 | Beintner et al. | 257/513 |
| 6,074,930 A | * | 6/2000 | Cho et al. | 438/424 |
| 6,080,618 A | * | 6/2000 | Bergner et al. | 438/243 |
| 6,107,143 A | * | 8/2000 | Park et al. | 438/296 |
| 6,146,970 A | * | 11/2000 | Witek et al. | 438/424 |
| 6,150,212 A | * | 11/2000 | Divakaruni et al. | 438/244 |
| 6,271,143 B1 | * | 8/2001 | Mendicino | 438/700 |
| 6,414,364 B2 | * | 7/2002 | Lane et al. | 257/397 |
| 6,456,370 B1 | * | 9/2002 | Ingles, Jr. | 356/73.1 |
| 6,498,383 B2 | * | 12/2002 | Beyer et al. | 257/510 |
| 6,566,228 B1 | * | 5/2003 | Beintner et al. | 438/430 |

\* cited by examiner

Primary Examiner—Michael S. Lebentritt
(74) Attorney, Agent, or Firm—Foley & Lardner

(57) ABSTRACT

A method of manufacturing an integrated circuit (IC) utilizes a shallow trench isolation (STI) technique. The shallow trench isolation technique is used in strained silicon (SMOS) process. The liner for the trench is formed in a high temperature process after the trench is filled with an insulative material. The insulative material is provided in a low temperature process.

20 Claims, 3 Drawing Sheets

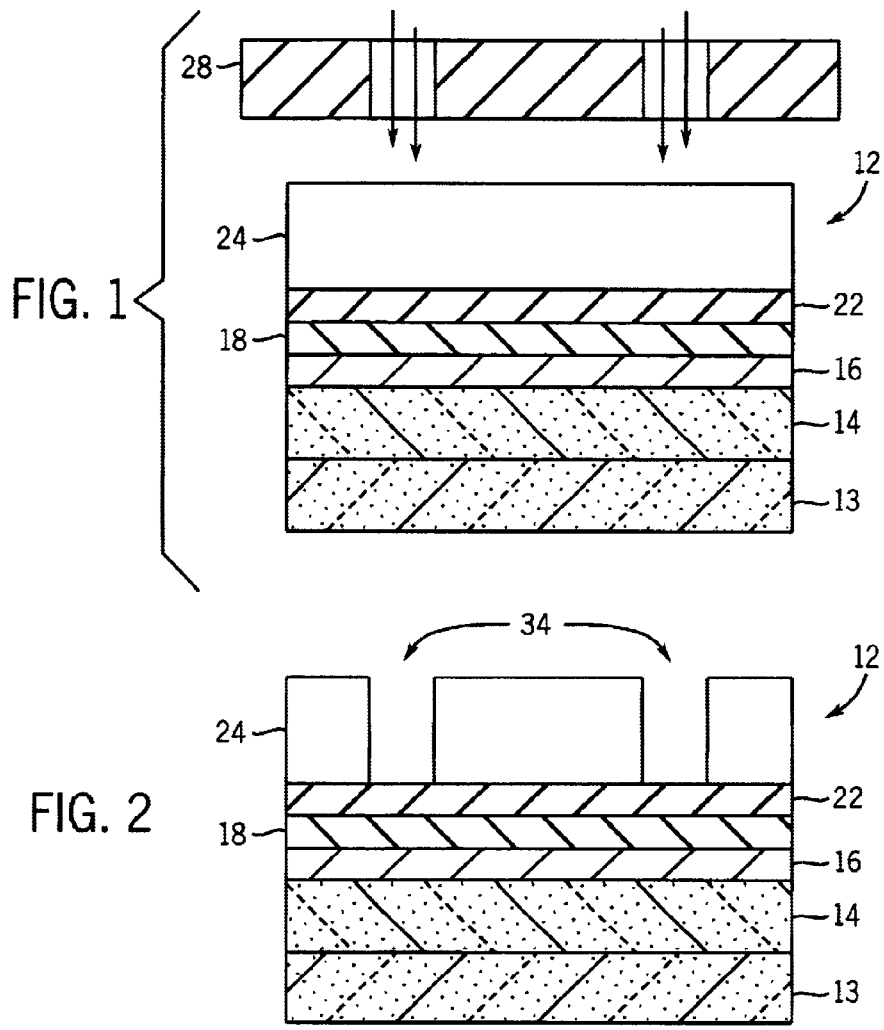
FIG. 1
FIG. 2
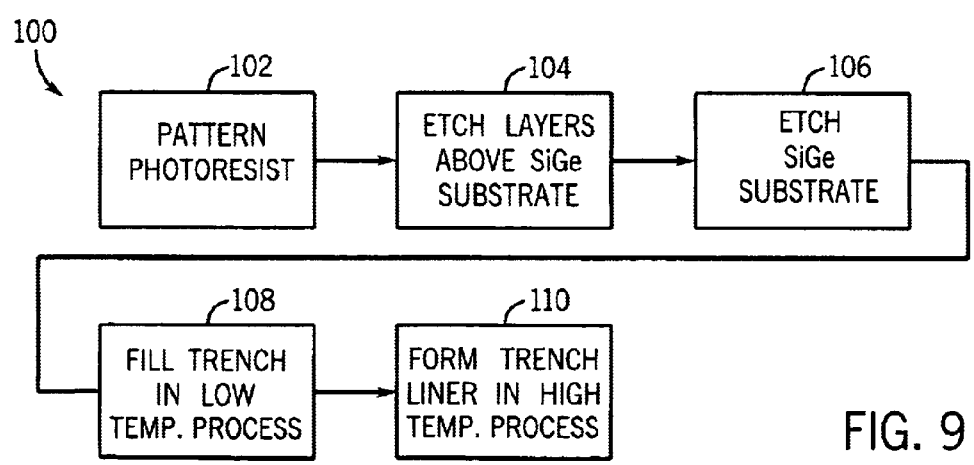
FIG. 9

POST TRENCH FILL OXIDATION PROCESS FOR STRAINED SILICON PROCESSES

CROSS REFERENCE TO RELATED APPLICATIONS

The present application is related to U.S. application Ser. No. 10/389,456, by Wang et al., filed on Mar. 14, 2003, U.S. application Ser. No. 10/341,863, by Ngo et al., filed on Jan. 14, 2003, and U.S. application Ser. No. 10/358,966, by Lin et al., filed on Feb. 5, 2003.

FIELD OF THE INVENTION

The present invention is related to integrated circuit (IC) devices and to processes of making IC devices. More particularly, the present invention relates to a method of forming trench isolation structures on substrates or layers including germanium.

BACKGROUND OF THE INVENTION

Integrated circuits (ICs) include a multitude of transistors formed on a semiconductor substrate. Various methods of forming transistors on a semiconductor substrate are known in the art. Generally, transistors are isolated from each other by insulating or isolation structures.

One method of forming transistors on a silicon substrate involves the well-known Local Oxidation of Silicon (LOCOS) process. A conventional LOCOS process typically includes the following simplified steps. First, a silicon nitride layer is thermally grown on the silicon substrate. Generally, conventional LOCOS processes require a high quality, thermally grown silicon nitride layer to avoid delamination and other processing problems. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the oxide only grows on the silicon substrate exposed during the source/drain patterning step. Finally, after oxide growth is complete, the remaining portions of the nitride layer are removed, leaving only the oxidized source/drain areas on the exposed silicon substrate.

Another process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner oxide is typically formed at a very high temperature in a hydrochloric (HCl) acid ambient. An insulative material, such as, silicon dioxide ($SiO_2$), is blanket deposited over the nitride layer and the liner oxide within the trench. The insulative material is polished to create a planar surface. The nitride layer is subsequently removed to leave the oxide structures within the trenches.

Shallow trench isolation (STI) structures are utilized in strained silicon (SMOS) processes. SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

The use of germanium in SMOS processes can cause germanium contamination problems for IC structures, layers, and equipment. In particular, germanium outgassing or outdiffusion can contaminate various components associated with the fabrication equipment and integrated circuit structures associated with the processed wafer. Further, germanium outgassing can negatively impact the formation of thin films. In addition, germanium outdiffusion can cause germanium accumulation or "pile-up" at the interface of the liner, thereby causing reliability issues for the STI structure.

Germanium outgassing can be particularly problematic at the very high temperatures and HCl ambient environments associated with the liner of a shallow trench isolation (STI) structure. For example, conventional STI liner oxide processes can utilize temperatures of approximately 1000° C., which enhance germanium outgassing.

Thus, there is a need for an STI liner which can be formed without causing significant germanium outdiffusion. Further still, there is a need for a process of forming high quality oxides with good compatibility and yet are not susceptible to germanium outgassing. Further still, there is a need for an SMOS trench liner formation process. Yet further, there is a need for a liner formation process that is not as susceptible to germanium outgassing. Further still, there is a need for an STI process that does not utilize high temperature to thermally grow liners when germanium trenches are exposed.

SUMMARY OF THE INVENTION

An exemplary embodiment relates to a method of manufacturing an integrated circuit. The integrated circuit includes trench isolation regions in a substrate including germanium. The method includes forming a silicon nitride layer above the substrate, and selectively etching the silicon nitride layer to form apertures associated with locations of the trench isolation (STI) regions. The method also includes forming trenches in the substrate at the locations, forming trench fill material in the trenches at a low temperature, and forming oxide liners in the trenches of the substrate in a high temperature process.

Yet another exemplary embodiment relates to a method of forming shallow trench isolation regions in a semiconductor layer. The method includes providing a hard mask layer above the semiconductor layer, providing a photoresist layer above the hard mask layer, and selectively removing portions of the photoresist layer in a photolithographic process. The method further includes removing the hard mask layer at locations, forming trenches in the hard mask layer under the locations, filling the trench with an insulative material in a low temperature process, and forming a liner in the trenches in a high temperature process.

Yet another exemplary embodiment relates to a method of forming a liner in a trench in a germanium containing layer. The method includes selectively etching the germanium containing layer to form the trench, filling the trench with an insulative material in a low temperature process and performing high temperature oxidation to form the liner in the trench.

BRIEF DESCRIPTION OF THE DRAWINGS

Exemplary embodiments will become more fully understood from the following detailed description, taken in conjunction with the accompanying drawings, wherein like reference numerals refer to like parts, and wherein:

FIG. 1 is a cross-sectional view schematic drawing of a portion of a silicon germanium substrate including a strained silicon layer, an oxide layer, a hard mask layer and a photoresist layer in accordance with an exemplary embodiment of a shallow trench isolation (STI) process;

FIG. 2 is a cross-sectional view of the portion illustrated in FIG. 1, showing a lithographic patterning step;

FIG. 9 is a general block diagram showing a shallow trench isolation process for the portion illustrated in FIG. 1.

DETAILED DESCRIPTION OF REFERRED EXEMPLARY EMBODIMENTS

Figure 3:
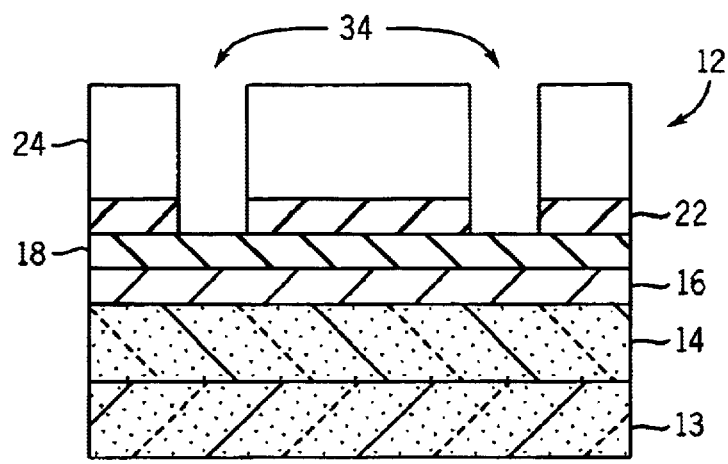
FIG. 3 is a cross-sectional view of the portion illustrated in FIG. 2, showing a selective etching step for the hard mask layer.

FIGS. 1 through 9 illustrate a method of manufacturing an integrated circuit (IC) in accordance with an exemplary embodiment. The method illustrated in FIGS. 1 through 9 reduces germanium outgassing and outdiffusion problems associated with silicon germanium layers or structures. The process can be used in a shallow trench isolation (STI) process or any process requiring a liner oxide and utilizing germanium or other substance prone to outgassing at high temperature. Advantageously, a liner oxide layer can be formed at high temperature after the trench is filled in a low temperature process and yet provides a high quality oxide with good compatibility. For the purposes of the embodiment described with reference to FIGS. 1–9, a low temperature process refers to a process performed at a temperature of less than approximately 700° C.

Referring to FIGS. 1 through 9, a cross-sectional view of a portion 12 of an integrated circuit (IC) is illustrated. Portion 12 is subjected to process 100 (FIG. 9) to form a shallow trench isolation (STI) structure. Portion 12 includes an oxide layer 18 provided over a strained silicon layer 16. Layer 16 is provided over a semiconductor substrate 14 or a germanium containing layer or substrate. Substrate 14 can be provided above a substrate 13.

Substrate 13 is optional and portion 12 can be provided with substrate 14 as the bottom-most layer. An alternative embodiment can use a substrate without a substrate, such as, substrate 13 beneath it. Substrate 13 can be the same material or a different material than substrate 14. In one embodiment, substrate 13 is a semiconductor substrate, such as, a silicon substrate upon which silicon germanium substrate 14 has been grown.

Portion 12 can be any type of semiconductor device, or portion thereof, made from any of the various semiconductor processes, such as, complementary metal oxide semiconductor (COMs) process, bipolar process, or other semiconductor process. Portion 12 may be an entire IC or a portion of an IC including a multitude of electronic component portions.

Substrate 14 is preferably silicon germanium or another semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1–0.4). Layer 14 can be grown or deposited.

In one embodiment, layer 14 is grown above layer 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or alternatively, the partial pressure of germanium may be gradually increased beginning from a lower pressure or zero pressure to form a gradient composition. Alternatively, a silicon layer can be doped by ion implantation with germanium or other processes can be utilized to form layer 14. Preferably, layer 14 is grown by epitaxy to a thickness of less than approximately 5000 Å (and preferably between approximately 1500 Å to 4000 Å).

A strained silicon layer 16 is formed above layer 14 by an epitaxial process. Preferably, layer 16 is grown using tetrachlorosilane (SiCl4) at a temperature of between approximately 750 and 900° C. Layer 16 can be a pure silicon layer and have a thickness of between approximately 100 and 500 Å.

Pad oxide film or oxide layer 18 is provided on layer 16. Layer 18 is optional. Layer 18 is preferably thermally grown on top of layer 16 to a thickness of between approximately 100 and 300 Å. Layer 16 serves as a buffer layer and can be thermally grown in a conventional high temperature process by heating to approximately 1000° C. in an oxygen atmosphere. Germanium outdiffusion or outgassing is not a major problem at this point due to the presence of layer 18.

A barrier or hard mask layer 22 is provided over oxide layer 18. Preferably, mask layer 22 is silicon nitride ($Si_3N_4$) provided at a thickness of between approximately 300 and 1000 Å by a deposition process. Preferably, mask layer 22 is provided in a CVD or growth process. A low pressure, plasma enhanced chemical vapor deposition (PECVD) process can also be utilized. A conventional thermal nitride process using a dichlorosilane ($SiH_2Cl_2$), ammonia ($NH_3$) and nitrogen ($N_2$) mixture at a high temperature (e.g., approximately 600° C. or above) can be used. The PECVD process for depositing nitride uses silane ($SiH_4$), nitrogen ($N_2$), and ammonia ($NH_3$) with a power of between approximately 550 and 650 watts at 400° C. An ammonia ($NH_3$) silane ($SiH_4/N_2$) mixture plasma, as opposed to a $N_2/NH_3/SiCl_2H_2$ associated with conventional CVD or growth process, can be used to form mask layer 22.

A photoresist layer 24 is spun on top of mask layer 22. Preferably, photoresist layer 24 is any commercially available i-line or deep UV photoresist such as (Shipley Corp., MA) SPR 955 (i-line) UV5 (deep UV). In FIG. 2, photoresist layer 24 is selectively removed via photolithographic process using pattern 28 to leave apertures 34 in accordance with a step 102 (FIG. 9) of process 100. In FIG. 3, mask layer 22 is etched via a dry-etching process so that apertures 34 reach oxide layer 18 in accordance with a step 104 of process 100 (FIG. 9). The dry-etching process is selective to silicon nitride with respect to oxide layer 18. Layer 24 can be stripped after mask layer 22 is etched.

Figure 4:
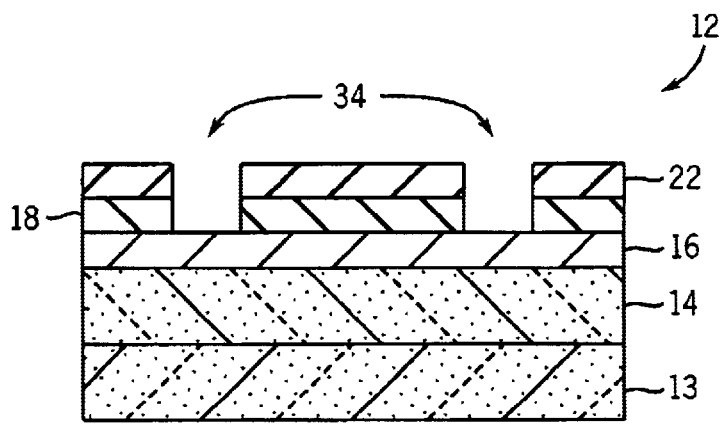
FIG. 4 is a cross-sectional view of the portion illustrated in FIG. 3, showing a selective etching step for the oxide layer.

In FIG. 4, the etch process is changed to etch through silicon dioxide material and layer 18 is etched so that apertures 34 reach layer 16 in accordance with step 104 of process 100 (FIG. 9). Layer 18 can be etched in a dry etching process. Alternatively, other etching techniques can be utilized to remove selected portions of layer 18. Photoresist layer 24 (FIG. 1) can be removed before or after oxide layer 18 is etched.

Figure 5:
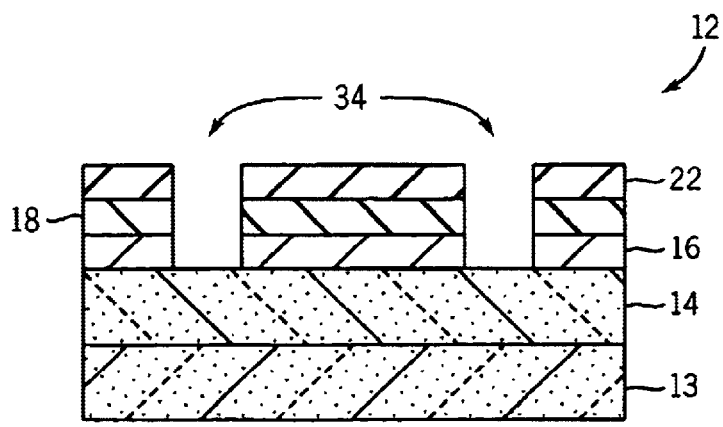
FIG. 5 is a cross-sectional view of the portion illustrated in FIG. 4, showing a selective etching step for the strained silicon layer.

In FIG. 5, the etch process is changed to etch through silicon material. Strained silicon layer 16 can be removed in accordance with a dry-etching process so that apertures 34 reach substrate 14.

Figure 6:
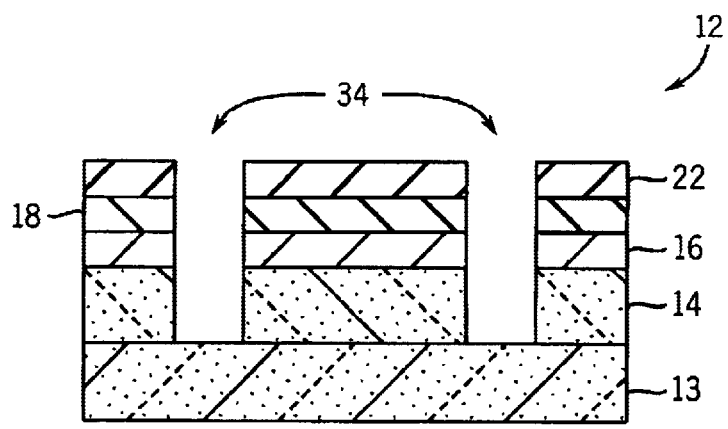
FIG. 6 is a cross-sectional view of the portion illustrated in FIG. 5, showing a selective etching step for the germanium silicon substrate.

In FIG. 6, substrate 14 is etched through apertures 34 to form trenches for shallow trench isolation structures in accordance with a step 106 of process 100 (FIG. 9). The trenches preferably have a width corresponding to apertures 34. The trenches preferably have a depth of between approximately 1500 and 4000 Å and a width of 0.18–1.50 μm or less. The trenches can have a trapezoidal cross-sectional shape with the narrower portion being at the bottom. Substrate 14 is preferably etched in a dry-etching process to form the trenches. Substrate 14 can be etched in the same step as layer 16.

Although described as being etched in a dry etching process, the trenches can be formed in any process suitable for providing apertures in layer 14. In one embodiment, the apertures for the trenches are provided all the way through layer 14 to substrate 13. Alternatively, the bottom of the trenches associated with apertures 34 may not reach substrate 13, depending upon the thickness of layer 14. In an embodiment in which substrate 13 is not provided, substrate 14 is deeper than the trenches associated with apertures 34.

Figure 7:
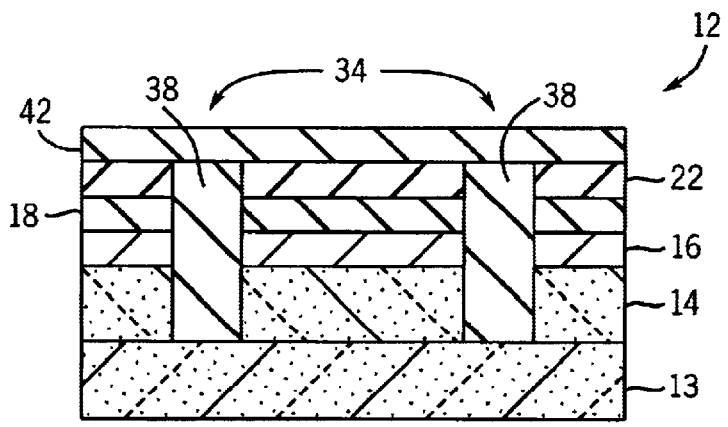
FIG. 7 is a cross-sectional view of the portion illustrated in FIG. 6, showing a trench fill step.

In FIG. 7, a layer of insulative material 42 is blanket deposited over layer 16 and within the trenches associated with apertures 34 of a step 108 of process 100. Insulative material 42 is preferably silicon dioxide deposited in a CVD process. Preferably, insulative material 42 is deposited in a tetraethylorthosilicate (TEOS) process at low temperature.

Insulative material 42 is preferably between approximately 2000 and 8000 Å thick and entirely fills the trenches associated with apertures 34.

Insulative material 42 can be a blanket deposited layer by low pressure chemical vapor deposition (LPCVD) or plasma enhanced chemical vapor deposition (PECVD) in a process performed before liners are formed in the trenches. Unlike conventional processes, liner formation is performed after insulative material 42 is deposited. A tetraethylorthosilicate (TEOS) LPCVD $SiO_2$ film can be deposited at a temperature of approximately 400° C. using a $SiH_4$ gas. Insulative material 42 within the trenches serves as trench fill material 38.

Figure 8:
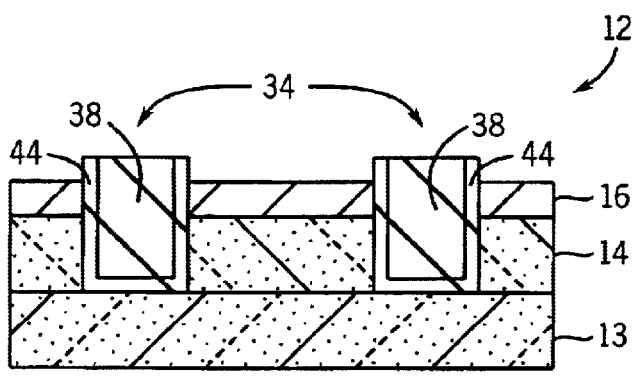
FIG. 8 is a cross-sectional view of the portion illustrated in FIG. 7, showing a high temperature liner formation step.

In FIG. 8, insulative material 42 is removed by polishing/etching until a top surface of layer 16 is reached. The removal of insulative material 42 leaves oxide material or trench fill material 38 within the trenches associated with apertures 34. Insulative material 42 can be removed by a number of stripping or etching processes. Preferably, insulative material 42 is removed from above layer 16 by dry-etching.

In one embodiment, insulative material 42 is deposited after the trenches are formed and before mask layer 22 is stripped. The insulative material is polished or etched until mask layer 22 is reached. Layers 22 and 18 can be stripped in a subsequent process.

In an alternative embodiment, insulative material 42 can be provided after layers 22 and 18 are stripped. In this embodiment, insulative material 42 is provided directly above layer 16.

Although insulative material 42 is shown in FIG. 8 as extending above layer 16, insulative material 42 can be formed within the trenches to stop at a top surface of layer 16.

In FIG. 8, liners 44 are formed in the trenches associated with apertures 34 at a step 110 of process 100 (FIG. 9). Liners 44 are represented with a dotted line within trench fill material 38. Preferably, liners 44 are oxide (e.g., silicon oxide or silicon dioxide) material formed in a thermal oxidation process. In one embodiment, liners 44 are between approximately 50 and 100 Å thick and are provided over the bottom and side walls of the trenches. In one embodiment, layers 22 and 18 are stripped before the formation of liners 44. In another embodiment, layers 18 and 22 are not stripped until after liners 44 are formed.

Preferably, liners 44 are formed in a high temperature oxidation step at a temperature between approximately 900 and 1000° C. in an oxygen ambient. Advantageously, fill material 38 provides a cap that prevents germanium outgassing from the trenches.

Material 38 provides oxidizing species for liners 44. The oxygen ($O_2$) and water ($H_2O$) content of trench fill material 38 advantageously oxidizes to form liners 44 associated with the trench bottom and sidewalls. The oxidation process can utilize an atmosphere of oxygen at a temperature of between approximately 900 and 1000° C. in one preferred embodiment.

It is understood that while the detailed drawings, specific examples, and particular values given provide a preferred exemplary embodiment of the present invention, it is for the purpose of illustration only. The shapes and sizes of trenches are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. A method of manufacturing an integrated circuit having trench isolation regions in a substrate including germanium, the method comprising:

forming a silicon nitride layer above the substrate;

selectively etching the silicon nitride layer to form apertures associated with locations of the trench isolation regions;

forming trenches in the substrate at the locations;

providing trench fill material in the trenches at a low temperature; and forming oxide liners in the trenches of the substrate in a high temperature process.

2. The method of claim 1, wherein the trench fill material is silicon dioxide.

3. The method of claim 2, further comprising removing the trench fill material until the silicon nitride layer is reached before the forming oxide liners step.

4. The method of claim 1, wherein the low temperature process is one of an LPCVD oxide deposition process and a tetraethylorthosilicate (TEOS) deposition process.

5. The method of claim 1, wherein the low temperature process is performed at a temperature below 700° C.

6. The method of claim 1, wherein the high temperature process uses a temperature between approximately 900 and 1000° C.

7. The method of claim 1, wherein the high temperature process uses water and oxygen associated with the trench fill material to form the oxide liners.

8. The method of claim 1, wherein the low temperature is less than 600° C.

9. A method of forming shallow trench isolation regions in a semiconductor layer, the method comprising:

providing a hard mask layer above the semiconductor layer;

providing a photoresist layer above the hard mask layer;

selectively removing portions of the photoresist layer at locations in a photolithographic process;

removing the hard mask layer at the locations;

forming trenches in the hard mask layer under the locations;

filling the trenches with an insulative material in a low temperature process; and forming a liner in the trenches in a high temperature process.

10. The method of claim 9, further comprising providing a pad oxide layer above a strained silicon layer before the providing a hard mask layer step.

11. The method of claim 10, further comprising removing the pad oxide layer at the locations before the forming trenches step.

12. The method of claim 9, wherein the insulative material is deposited in the trenches by chemical vapor deposition.

13. The method of claim 12, wherein the insulative material is silicon dioxide.

14. The method of claim 9, wherein the high temperature process is performed at a temperature above 900° C.

15. The method of claim 14, wherein the low temperature process is performed at a temperature below 700° C.

16. The method of claim 15, wherein the liner is silicon dioxide grown in water and oxygen associated with the insulative material.

17. A method of forming a liner in a trench in a germanium containing layer, the method comprising:

selectively etching the germanium containing layer to form the trench;

filling the trench with an insulative material in a low temperature process; and performing high temperature oxidation to form the liner in the trench.

18. The method of claim 17, wherein the low temperature process is a tetraethylorthosilicate (TEOS) process.

19. The method of claim 17, wherein the low temperature process is performed at a temperature below 700° C.

20. The method of claim 19, wherein the liner is between approximately 50 and 100 Å thick.

* * * * *

UNITED STATES PATENT AND TRADEMARK OFFICE
CERTIFICATE OF CORRECTION

PATENT NO. : 6,673,696 B1
DATED : January 6, 2004
INVENTOR(S) : Farzad Arasnia, Minh-Van Ngo and Qi Xiang It is certified that error appears in the above-identified patent and that said Letters Patent is hereby corrected as shown below:

<u>Title page,</u>
Item [75], Inventors, delete "Qi Ziang" and insert therefor -- Qi Xiang --.

Signed and Sealed this

Twentieth Day of September, 2005

JON W. DUDAS
*Director of the United States Patent and Trademark Office*